United States Patent [19]

Schweizer

[11] Patent Number: 5,674,414
[45] Date of Patent: Oct. 7, 1997

[54] METHOD AND APPARATUS OF IRRADIATING A SURFACE OF A WORKPIECE WITH A PLURALITY OF BEAMS

[75] Inventor: Jürgen Schweizer, Westerhofen, Germany

[73] Assignee: Carl-Zeiss Stiftung, Oberkochen, Germany

[21] Appl. No.: 422,575

[22] Filed: Apr. 14, 1995

[30] Foreign Application Priority Data

Nov. 11, 1994 [DE] Germany ............... 44 40 117.5

[51] Int. Cl.$^6$ .................................................. B23K 26/06
[52] U.S. Cl. .......................... 219/121.77; 219/121.74; 355/67
[58] Field of Search ................. 219/121.73, 121.74, 219/121.75, 121.76, 121.77; 250/492.1, 492.2, 492.22, 492.23; 359/203, 204, 223; 355/43, 53, 66, 67

[56] References Cited

U.S. PATENT DOCUMENTS

| | | | |
|---|---|---|---|
| 3,364,497 | 1/1968 | MacAdam | 219/121.77 |
| 3,594,081 | 7/1971 | Tschink | 355/67 |
| 4,553,017 | 11/1985 | Addleman . | |
| 4,623,776 | 11/1986 | Buchroeder et al. . | |
| 4,713,518 | 12/1987 | Yamazaki et al. . | |
| 4,950,862 | 8/1990 | Kajikawa . | |
| 5,041,862 | 8/1991 | Rossman et al. . | |
| 5,055,653 | 10/1991 | Funami et al. . | |
| 5,101,091 | 3/1992 | Grub et al. | 219/121.74 |
| 5,113,055 | 5/1992 | Kuriyama . | |
| 5,191,374 | 3/1993 | Hazama et al. | 355/43 |
| 5,268,554 | 12/1993 | Ream . | |
| 5,440,423 | 8/1995 | Ogura | 219/121.74 |
| 5,452,054 | 9/1995 | Dewa et al. | 355/67 |

FOREIGN PATENT DOCUMENTS

| | | | |
|---|---|---|---|
| 199650 | 10/1986 | European Pat. Off. | 219/121.74 |
| 0360328 | 3/1990 | European Pat. Off. . | |
| 2708039 | 4/1979 | Germany . | |
| 4111876 | 10/1991 | Germany . | |
| 4328894 | 3/1994 | Germany . | |
| 61-186187 | 8/1986 | Japan | 219/121.74 |
| 1-271088 | 10/1989 | Japan | 219/121.74 |
| 4-266492 | 9/1992 | Japan | 219/121.77 |

OTHER PUBLICATIONS

"Leiterplatten direkt belichten", Mark & Technik, No. 20, May 15, 1992, pp. 18 and 19.

Primary Examiner—Geoffrey S. Evans
Attorney, Agent, or Firm—Walter Ottesen

[57] ABSTRACT

A method and apparatus for irradiating a surface of a workpiece utilizing several discrete component beams. The irradiation exposes a photosensitive layer on a surface of a workpiece to be processed. A deflecting device is provided having a plurality of elements assigned to corresponding ones of the component beams. Each component beam is directed individually or in combination with other component beams by the deflecting device. In this way, different points and zones on the surface of the workpiece to be processed can be irradiated simultaneously.

14 Claims, 5 Drawing Sheets

METHOD AND APPARATUS OF IRRADIATING A SURFACE OF A WORKPIECE WITH A PLURALITY OF BEAMS

FIELD OF THE INVENTION

The invention relates to a method of irradiating a surface of a workpiece utilizing several discrete component beams.

BACKGROUND OF THE INVENTION

Arrangements for carrying out irradiating processes of this kind have been known for some time in the state of the art.

In an arrangement disclosed in U.S. Pat. No. 5,268,554, the beam of a laser is focused via different mirrors onto the surface of a specimen to be processed. The position of a deflecting mirror can be changed in two axes by means of actuators and the laser beam can be guided to discrete work points in a specific area on the surface of the specimen to be processed. Several exposure points are processed sequentially. It is furthermore disadvantageous that the point of incidence on the workpiece surface has a different size in dependence upon the deflection of the laser beam.

A material irradiating arrangement is disclosed in U.S. Pat. No. 5,113,055 which includes an optical system of several mirror segments arranged one behind the other. With the aid of this system, selectively several points on a workpiece surface can be approached sequentially.

A multiple beam generating device is disclosed in U.S. Pat. No. 4,553,017 wherein several beams are generated from one energy beam by means of a grating. The foci of the beams all lie on a line.

A further beam dividing device for laser beams is disclosed in German Patent 4,328,894. This device generates two discrete beams from a laser beam which then impinge upon two points on the workpiece surface. Reference may also be made to European Patent publication 0,360,328, German Patents 4,111,876 and 2,708,039 and U.S. Pat. No. 4,623,776.

Material irradiating devices are disclosed in U.S. Pat. Nos. 4,713,518 and 5,055,653 in which several discrete laser beams are generated from one laser beam by means of several lenses lying one next to the other in one direction.

A material irradiating device is disclosed in U.S. Pat. No. 4,950,862 wherein a laser beam is directed onto a lens array by means of a galvanometer mirror. Each lens of the array images one beam onto the workpiece surface.

Conductor tracks on printed circuit boards such as in the area of metal-resist technology are produced at the present time as delineated below wherein those steps are listed which occur between the drilling operation and the application of the solder-resist lacquer.

(1) A plastic board or plastic foil is provided which is laminated with copper or another conducting material. The plastic board or foil is coated with a photosensitive resist.

(2) With the aid of a film mask, the negative pattern of the desired conductor tracks is projected onto the above-mentioned board utilizing a projection optic. A suitable light is used in such a manner that the resist cures on the exposed locations. This light is generally ultraviolet light.

(3) The exposed board is dipped in a development bath and the unexposed zones of the resist are removed and the copper structures of the conductor tracks to be provided later are cleared (uncoated) as is generally known in the state of the art.

(4) Copper is galvanically built up to the desired conductor track thickness on the uncoated copper tracks.

(5) Now, for example, a tin-lead etch resist is galvanically applied to the built-up copper tracks.

(6) The residual cured resist is removed (stripped) in a suitable etching bath and, in a further etching bath, the now free copper surfaces are etched away with the conductor tracks being protected by the metal resist.

As an alternative, the following method is also state of the art for fine printed circuit board structures. The process takes place as described above but the printed circuit board is now coated with a liquid resist (photoresist). In contrast to the film resist mentioned above, the photoresist does not cure in response to light exposure but is instead destroyed.

After the photoresist has dried, the positive pattern of the desired conductor tracks (that is, the conductor track pattern) is itself projected onto the printed circuit board with light at a suitable wavelength. This destroys the photoresist at these locations.

The exposed printed circuit board is then dipped into a development bath whereby the destroyed photoresist is removed so that the copper structures of the conductor tracks to be provided later are cleared (uncoated).

This alternative process is continued in accordance with the steps already described above.

It is disadvantageous, inter alia, with this exposure method that a photomask is necessary for projection. The precision of the edges or lines of the conductor tracks to be produced is dependent upon the resolving capacity of the photomask. For this reason, the accuracy of the edges or lines is, however, dependent upon the size of the photopixel as the smallest unit and, especially, on the discontinuity of the film mask. The mask changes with respect to its geometry under the influence of temperature, humidity and air pressure. This becomes so disturbing when generating fine structures (<100 μm) that, in lieu of films, glass plates must be used in part as mask carriers which, however, makes this process step significantly more expensive.

As mentioned, pretreated printed circuit boards can be exposed with laser radiation of suitable wavelength (for example, ultraviolet laser) utilizing a laser-light resistant mask. This method has the disadvantage of a fixed arrangement of the conductor tracks because of the structuring of the mask. A change of the arrangement of the conductor tracks requires a different mask.

However, direct exposure devices are known with which the resist layer above the later-desired conductor tracks or surfaces free of conductor tracks can be cured or destroyed utilizing a numerically-controlled laser beam.

One can either expose without a mask or remove material utilizing the single beam laser method. The laser beam is individually directed onto that location at which an exposure or removal of material is wanted. The significant disadvantage here is the time needed for producing a plurality of conductor tracks or for producing areas free of conductor paths or for producing holes and structures.

Jenoptik of Jena, Germany, provides an apparatus commercially identified as DirectPrint 40 with which a direct exposure of the resist layer on the printed circuit board takes place via a laser beam. The printed circuit board is coated with a conductive material. The laser beam is guided over the printed circuit board, which is coated with a photosensitive resist, by means of a scanning mirror. Although this equipment permits rather fine conductor tracks to be produced, it does, however, require an irradiation time which is too long.

An article appears in the journal "Markt&Technik", volume 20, May 15, 1992, pages 18 and 19, which discusses this subject matter. From this article, it is readily apparent that the time needed for direct exposure equipment is too long for manufacturing companies. This article also mentions the energy per $cm^2$ (for a commercially available resist) required for exposing the photosensitive layer.

SUMMARY OF THE INVENTION

In view of the foregoing, it is an object of the invention to provide a method for a material exposing device which is rapid and can be used for various tasks.

The method of the invention is for irradiating a workpiece having a photosensitive layer formed thereon. The method includes the steps of: forming a plurality of discrete component beams; providing a deflecting device having a plurality of elements corresponding to the component beams; and, utilizing the elements to deflect each of the component beams individually or in combination with other ones of the component beams onto the photosensitive layer so as to simultaneously irradiate different points and zones on the surface of the workpiece thereby exposing the photosensitive layer.

The exposure of a photosensitive layer by several beams simultaneously affords the advantage that the entire exposing operation can be significantly accelerated compared to exposing with only one laser beam and without any limitation with respect to versatility. It is with this exposure utilizing several laser beams simultaneously that a processing time is made possible which makes the use of machines of this kind economical.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
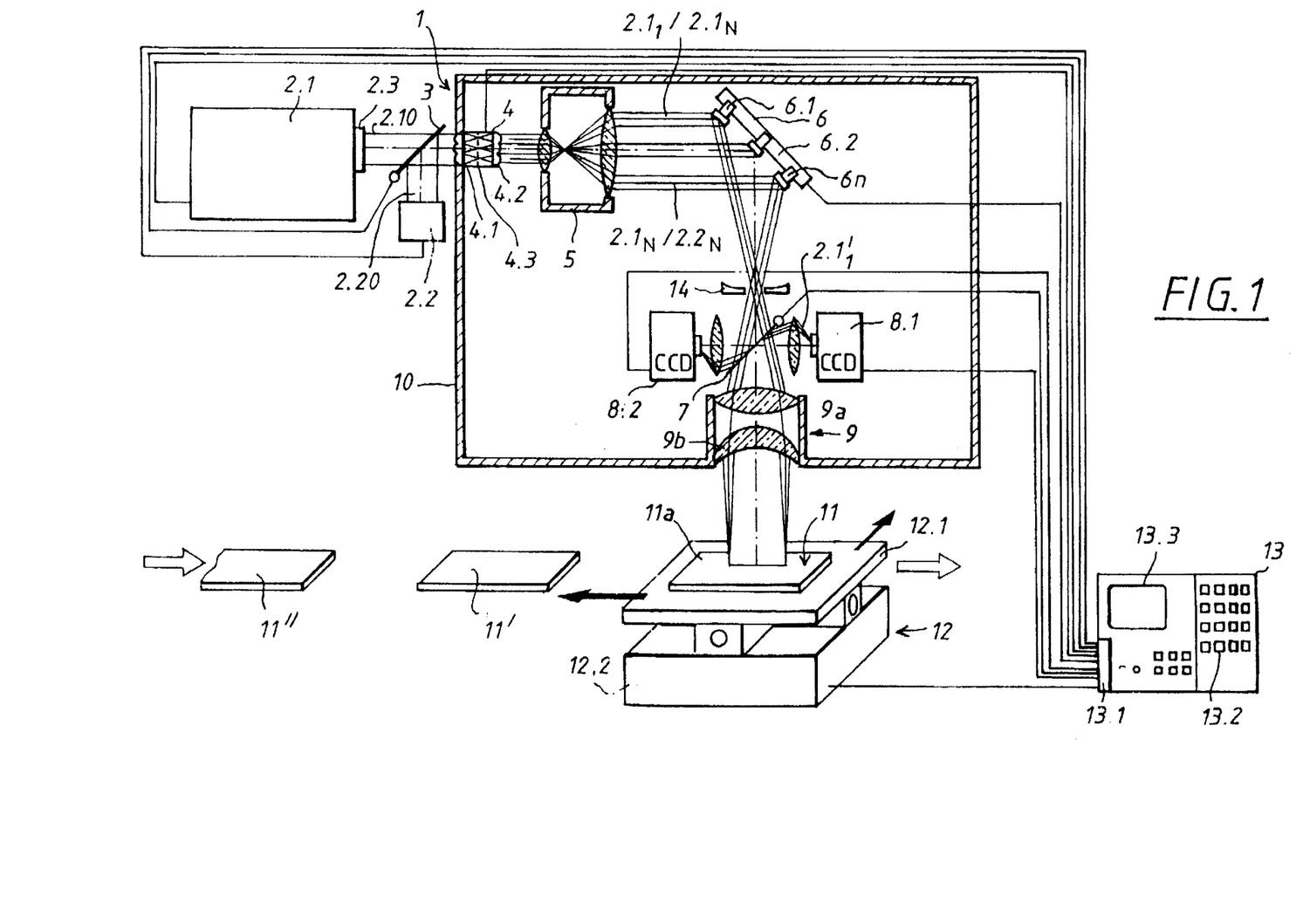
FIG. 1 is a schematic representation of the entire configuration of the apparatus for carrying out the method of the invention.

The arrangement 1 shown in FIG. 1 permits exposure at one or several locations or, with the same arrangement 1, the exposure can be at one or several locations with sequential or simultaneous material removal at one or several other locations for producing a hole and line pattern or a structure on a printed circuit board 11 which is coated with a photosensitive resist for exposure.

More specifically, the arrangement 1 is suitable for exposing a photosensitive layer on a printed circuit board (utilizing relatively weak ultraviolet radiation) as well as for tasks which include the removal of material to make through-holes in the printed circuit board (utilizing a relatively strong ultraviolet radiation). It is then advantageous if the laser beams which are utilized for material removal and for exposing have similar wavelengths. Excimer laser beams having a wavelength between 300 and 400 nm permit exposing resist materials presently commercially available as well as removing material (for example, a XeF laser having a 351 nm wavelength and a mean-pulsed power of 24 watts). With a XeF laser of this kind, several hundred exposing beams can be generated simultaneously because the required energy density for exposure lies between approximately 5 and 130 $mJ/cm^2$ depending upon the resist (solid or liquid) utilized.

Other lasers can be utilized in dependence upon the material to be removed or depending upon the resist to be exposed. Such lasers include, for example, a KrF laser (wavelength 248 nm), a XeCl laser (wavelength 308 nm), a $F_2$ laser (wavelength 157 nm), an ArF laser (wavelength 193 nm) or a $CO_2$ laser (wavelength 10 to 12μm).

Printed circuit boards 11 are needed in many variations as design aids and as connecting vehicles of electrical and electronic components in electronics.

It is essential for the arrangement 1 that it simultaneously has several component beams ($2.1_1$, . . . , $2.1_N$). These component beams are all deflected onto different discrete points on the surface 11a of the specimen 11 to be processed. In this way, the hole or line pattern (exposed conductor tracks or material removals) to be produced on the surface 11a of the specimens (11, 11', 11", . . . ), which are to be processed sequentially, can differ completely from each other.

The arrangement 1 has a laser beam input having a microlens optic for generating the individual beams ($2.1_1$, . . . , $2.1_N$). The microlens optic is used as a beam divider device 4 in which many individual beams ($2.1_1$, . . . , $2.1_N$) having parallel beam paths are generated from the incident laser beam (2.10, 2.20). The beam divider device 4 is shown in greater detail in FIGS. 3 and 4. The device comprises essentially two lens arrays (4.1, 4.2) arranged one behind the other with each lens array having a plurality of individual lenses (4.11, 4.21) arranged to define a surface. A pinhole diaphragm plate 4.3 is mounted between the two lens arrays (4.1, 4.2) and has a corresponding number of pinholes 4.31. The pinhole diaphragm plate 4.3 functions to improve beam geometry and is not absolutely necessary.

Figure 3:
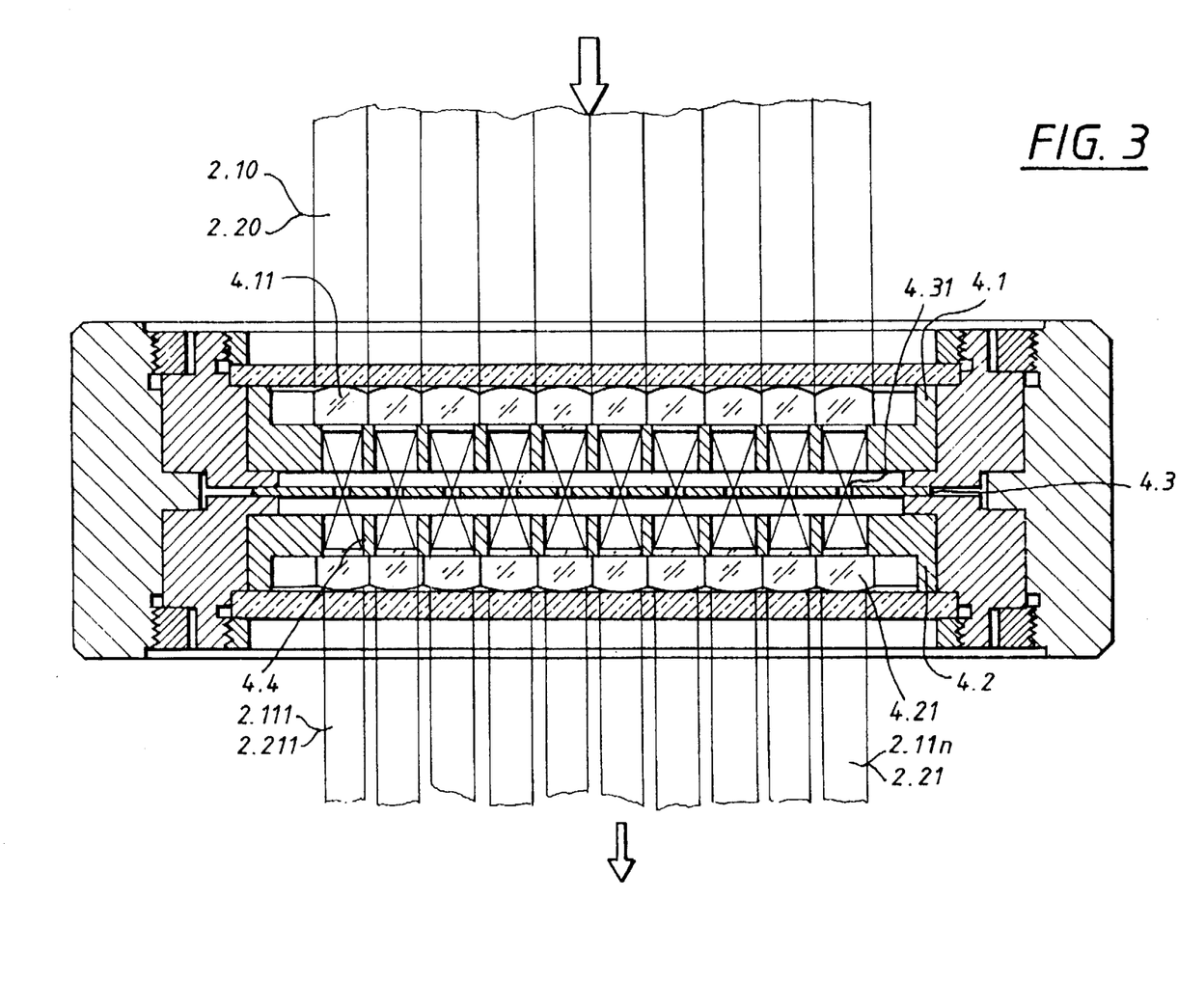
FIG. 3 is a side detail view of the beam dividing device.
Figure 4:
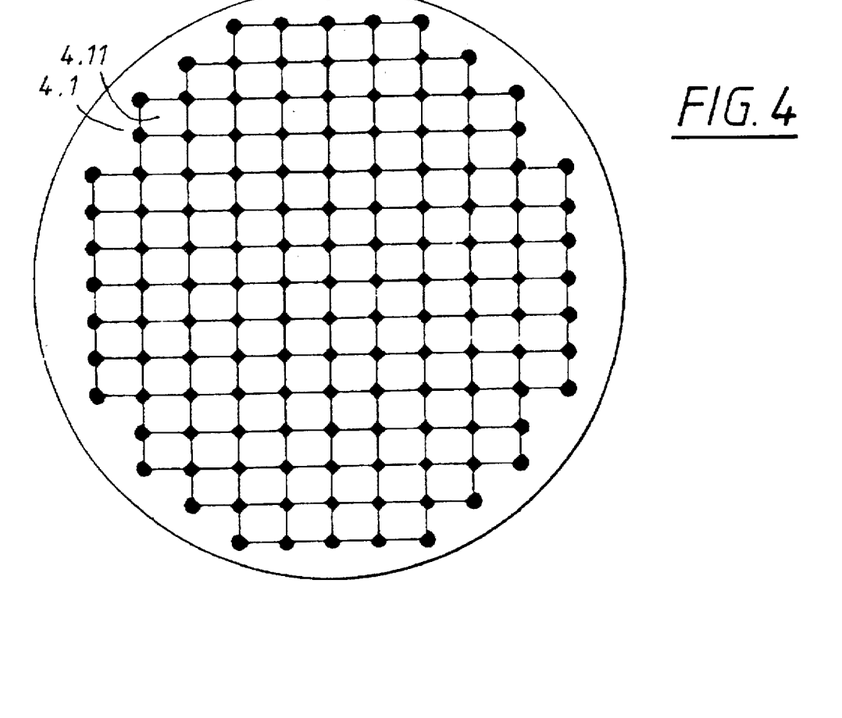
FIG. 4 is a plan view of the beam dividing device.

The incident laser beam (2.10, 2.20) is then broken down into many component laser beams (($2.1_1$, . . . , $2.1_N$), ($2.2_1$, . . . , $2.2_N$)) which have a certain spatial spacing to each other. The beam diameter of the component laser beams (($2.1_1$, . . . , $2.1_N$), ($2.2_1$, . . . , $2.2_N$)) can be changed by changing the lenses 4.21 of the rearward array 4.2 relative to the lenses 4.11 of the forward array 4.1. When desired, one or more diameters of the component laser beams (($2.1_1$, . . . , $2.1_N$), ($2.2_1$, . . . , $2.2_N$)) can be changed in that actuators are built into the supports 4.4 or the entire supports 4.4 can be configured as actuators in accordance with the state of the art (for example, piezo actuators, piston actuators or the like). In this way, a change in spacing between the lenses (4.11, 4.21) of the two lens arrays (4.1, 4.2) can be obtained.

Depending upon the quality of the radiation of the laser beam 2.10 emanating from the main laser 2.1, the laser beam 2.10 can be homogenized with respect to the quality of the radiation with a lens raster 2.3 according to U.S. Pat. No. 5,041,862 before impinging upon the beam divider unit 4. The lens raster 2.3 has a downstream device for parallelizing the laser beam 2.10.

In lieu of the laser beam 2.10 from the main laser 2.1, the laser beam 2.20 of the target laser 2.2 can pass through the beam divider device 4 at the same time with the laser beam 2.10 from the main laser 2.1. The target laser 2.2 is coupled into the beam path of the main laser 2.1 by a beam splitter 3. The photosensitive resist on the printed circuit board is not sensitive to the laser beam 2.20 of the target laser 2.2. The coating of the beam splitter 3 must be so configured that the laser beam 2.10 of the main laser 2.1 can be variably attenuated in a targeted manner or passes through the beam splitter 3 as undisturbed as possible and with the least possible loss; whereas, the laser beam 2.20 of the target laser 2.2 is coupled into the main beam path as completely as possible.

The beam attenuating device on the beam splitter 3 for carrying out the exposure can be configured as known in the state of the art. This beam attenuating device has the task of attenuating the laser light energy, which is dimensioned for processing material (that is, for coating removal), in such a manner that, in the processing plane, that is on the surface 11a of the workpiece 11, only the energy densities, which are needed for the exposure, of about 5 to 130 $mJ/cm^2$ are attained in lieu of the 750 to approximately 3,000 $mJ/cm^2$ which are necessary for material removal (for example, for structuring plastics such as, for example, polyimide foils). These energy densities are, however, dependent upon the material constants of the material to be irradiated and can be significantly less or greater than the values given.

A certain amount of the radiation energy is lost because of the beam splitter 3 and because of the beam divider device 4. The laser beam (2.10, 2.20) loses a significant amount of energy especially in the beam divider device 4 at the edges of the lenses 4.11 and at the pinhole diaphragm 4.3. The pinhole diaphragm 4.3 should be cooled as required. A significant loss of laser energy occurs especially at the array 4.1 and this loss can be minimized by an optimized arrangement of the individual lenses 4.11 of the array 4.1.

An optical magnification system 5 is mounted rearward of the beam divider device 4. This magnification system 5 adapts the beams $((2.1_1, \ldots, 2.1_N), (2.2_1, \ldots, 2.2_N))$ coming from the beam divider device 4 to the dimensions of the deflecting optic 6. The deflecting optic 6 is shown in detail in FIG. 5.

Figure 5:
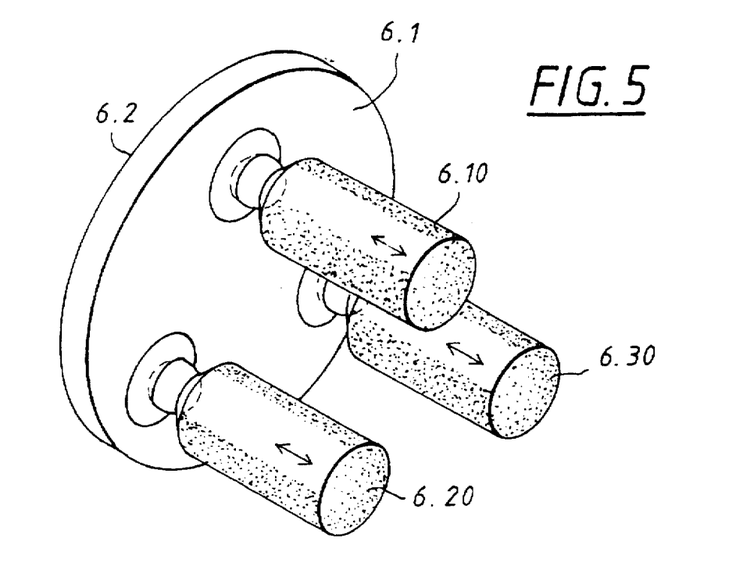
FIG. 5 is a bottom plan view of an element of the deflecting optic.

The deflecting optic 6 comprises essentially a plurality of individual elements $(6_1, \ldots, 6_N)$ having mirrored surfaces 6.2. This deflecting optic 6 can, for example, be moved in three axes via three actuators (6.10, 6.20, 6.30), respectively. These actuators can, for example, be piezocrystals or piston actuated elements. The component beams $((2.1_1, \ldots, 2.1_N), (2.2_1, \ldots, 2.2_N))$ reflected by the deflecting optic 6 then impinge on a scanning objective 9 which focuses the component beams $((2.1_1, \ldots, 2.1_N), (2.2_1, \ldots, 2.2_N))$ onto the surface 11a of the printed circuit board 11 to be exposed. At the same time, the scanning objective 9 ensures that the laser component beams $((2.1_1, \ldots, 2.1_N), (2.2_1, \ldots, 2.2_N))$ impinge perpendicularly or at least almost perpendicularly onto the surface 11a of the workpiece 11 to be exposed.

A collecting mask 14 is mounted forward of the scanning objective 9 and collects all component beams $((2.1_1, \ldots, 2.1_N), (2.2_1, \ldots, 2.2_N))$ which are not intended to reach the workpiece surface 11a. This collecting mask 14 is so configured that it nullifies the component beams $((2.1_1, \ldots, 2.1_N) (2.2_1, \ldots, 2.2_N))$ which impinge thereupon. This can lead to a very considerable warming of the mask 14 so that the latter is intensively cooled in correspondence thereto.

Still another beam splitter 7 is mounted between the collecting mask 14 and the scanning objective 9. This beam splitter 7 deflects a small portion of the laser light $((2.1_1, \ldots, 2.1_N), (2.2_1, \ldots, 2.2_N))$ impinging thereupon in the direction toward a camera 8.2. This camera 8.2 is a CCD-camera having a resolution so great that, with this camera, the position of the component beams $((2.1_1, \ldots, 2.1_N) (2.2_1, \ldots, 2.2_N))$ can be controlled with sufficient precision on the surface 11a of the workpiece 11 to be processed. The camera 8.2 then controls the deflecting optic 6. When the component laser beam $((2.1_1, \ldots, 2.1_N), (2.2_1, \ldots, 2.2_N))$ has impinged upon the surface 11a of the workpiece 11 via the scanning objective 9, then the scanning objective 9 reflects back a portion of the component laser beam. This back-reflected component laser beam $((2.1_1, \ldots, 2.1_N), (2.2_1, \ldots, 2.2_N))$ again passes through the scanning objective 9 and is deflected at the beam splitter 7 to a second camera 8.1.

The second camera 8.1 is also a CCD-camera and has a sufficiently large resolution of the work surface 11a of the workpiece 11 to be viewed. The progress of the component laser beams $((2.1_1, \ldots, 2.1_N), (2.2_1, \ldots, 2.2_N))$ on the surface 11a of the workpiece can be controlled by means of this camera 8.1 and, also with this camera, a determination can be made as to where the component beams $((2.1_1, \ldots, 2.1_N), (2.2_1, \ldots, 2.2_N))$ actually impinge upon the surface 11a of the workpiece 11.

The workpiece 11 to be exposed is itself mounted on an X-Y carrier 12 which moves the workpiece 11 in a plane (X, Y). When the workpiece 11 (for example, a printed circuit board) has a size which is greater than the size which can be exposed by the arrangement 1, the carrier 12 is so driven that, after ending the irradiation of a surface unit, a next adjacent surface unit can be processed. The precision with which the carrier 12 can be adjusted is then so high that the deviations of the irradiation points are sufficiently less than the set values mentioned.

All changeable elements $(2.1, 2.2, 3, 4.2, (6_1, \ldots, 6_N), 7, 12)$ of the arrangement 1 are connected to the input and the output 13.1 of a control 13. The control 13 distinguishes between material removal and exposure and activates and controls the beam attenuator on the beam splitter 3 for this purpose. This beam attenuator can be so configured that it attenuates only individual discrete component beams or attenuates all component beams simultaneously.

Furthermore, the cameras (8.1, 8.2) are connected to the input of the control. The control 13 is connected to the changeable elements $(2.1, 2.2, 3, 4.2, (6_1, \ldots, 6_N), 7, 12)$ as well as to the cameras (8.1, 8.2). Because of these connections, the control receives an announcement as to the actuating state of the individual changeable elements $(2.1, 2.2, 3, 4.2, (6_1, \ldots, 6_N), 7, 12)$ and is able to adjust the same in a targeted manner. The control 13 includes closed-loop control circuits which ensure that the surface 11a of the workpiece 11 is irradiated in the desired manner. In addition, the control 13 has an input 13.2 for inputting new processing parameters. Furthermore, the control has at least one monitor 13.3. The connected parts of the arrangement 1 can be adjusted by the control 13 or the beam splitters (3, 7) can be pivoted out of the beam path as desired.

The operation of the arrangement and the drive of the apparatus 1 at the central control 13 can be subdivided into the following modes of operation:

stand-by operation;

test and monitoring operation;

set-up mode of operation; and, working mode of operation.

After switch-on, the arrangement goes into the test and monitoring operation wherein all components connected to the control 13 are checked for faults. In the case where there are no faults, the control 13 then switches the arrangement 1 into the stand-by mode of operation wherein all components are operationally ready but not active.

The operation of the arrangement is described further below together with the description of the set-up and working modes of operation.

The coordinate table 12 is driven by the control 13 and positions the workpiece 11 or the portion of the surface 11a thereof to be processed in the work area below the scanning objective 9 in the set-up operation. A check is made as to the presence of the workpiece 11 by means of the viewing device 8.1 whereafter the hole image wanted on the workpiece 11 is adjusted by means of targeting laser beams as follows.

Starting from the control 13, either the work laser 2.1 generates the laser beam 2.10 or a so-called pilot or targeting laser 2.2 is activated. The laser beam 2.10 is attenuated by the pivoted-in beam splitter 3 in such a manner that it no longer has any exposing effect on the workpiece 11 but instead generates only light points observable by the monitoring systems 8.1 and 8.2. The so-called pilot or targeting laser 2.2 transmits a laser beam 2.20 into the irradiating arrangement 1 via the beam splitter 3 and this laser beam 2.20 likewise generates only light points on the workpiece 11 without the photosensitive layer being so illuminated thereby that, for later processing steps at the light points, a disturbing change is produced.

The laser beam 2.1 or the laser beam 2.2 is now broken up by the microlens optic 4 into a plurality of individual component beams (($2.1_1, \ldots, 2.1_N$), ($2.2_1, \ldots, 2.2_N$)) in correspondence to the number of microlenses (4.11, 4.21). The microlens optic 4 comprises essentially the microlens fields 4.1 and 4.2 as well as a field diaphragm 4.3. This break-up takes place essentially by means of a suitable arrangement of the microlens fields 4.1 and 4.2 with respect to each other. The individual component beams (($2.1_1, \ldots, 2.1_N$), ($2.2_1, \ldots, 2.2_N$)) run parallel to each other and are advantageously expanded and enlarged by means of a magnification optic 5.

The individual component beams (($2.1_1, \ldots, 2.1_N$), ($2.2_1, \ldots, 2.2_N$)) are now clearly separate from each other but yet are in a fixed geometric arrangement with respect to each other. These individual component beams (($2.1_1, \ldots, 2.1_N$), ($2.2_1, \ldots, 2.2_N$)) now impinge upon the tilt mirror field 6 which operates as a deflecting unit. The individual tilt mirrors ($6_1, \ldots, 6_N$) are advantageously fixed in the tilt mirror holder 6.2 so that each individual component laser beam $2.1_n$ always impinges precisely on one and the same tilt mirror $6_n$ for all individual mirrors $6_1$ to $6_N$.

The elements of the tilt mirror 6 now reflect the component laser beams (($2.1_1, \ldots, 2.1_N$), ($2.2_1, \ldots, 2.2_N$)) in dependence upon their respective positionings in such a manner that they all pass through the opening of the collecting mask 14 in regular operation and impinge upon the beam splitter 7. If certain component laser beams (($2.1_1, \ldots, 2.1_N$), ($2.2_1, \ldots, 2.2_N$)) are not intended to impinge upon the workpiece 11, then the corresponding tilt mirrors ($6_1, \ldots, 6_N$) are driven and displaced via the control 13 so that these component laser beams (16.1, ..., 16.M) are deflected into the collecting mask 14 whereas the wanted beams pass through in a bundle 15 of rays (see FIG. 2).

Figure 2:
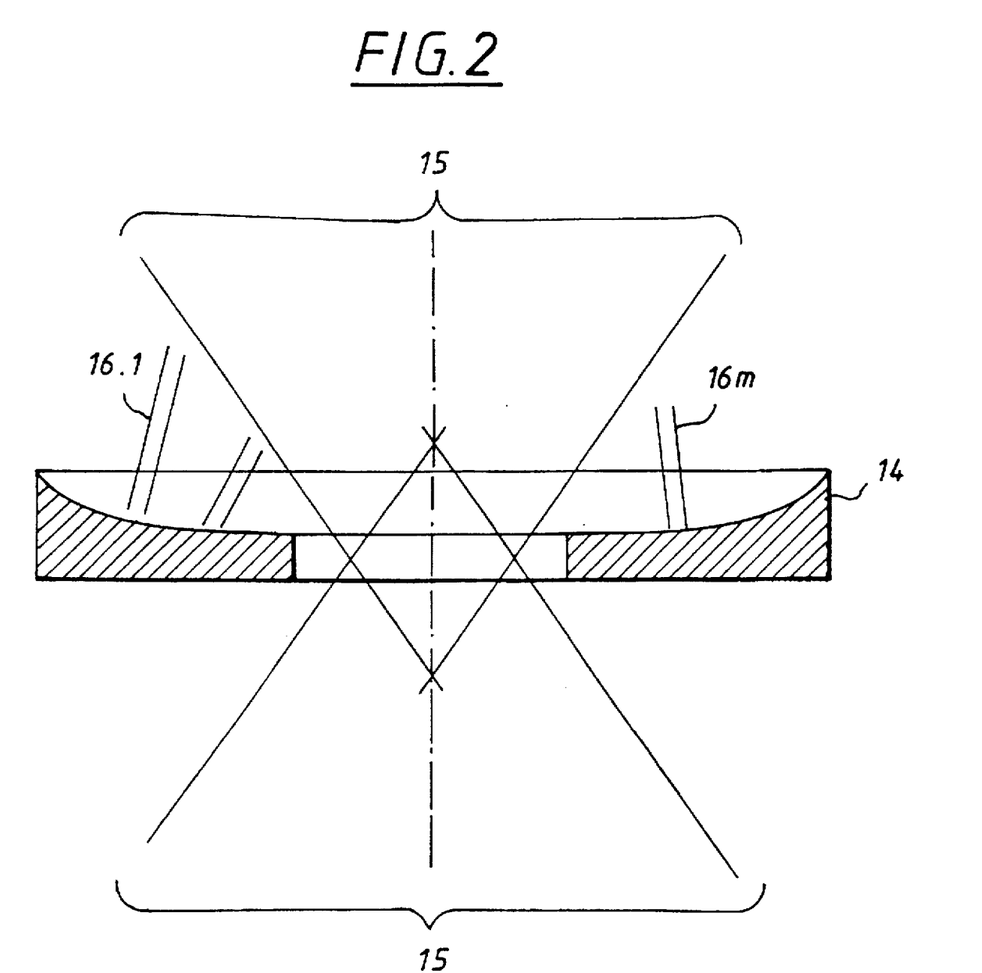
FIG. 2 is a detail view of the collecting mask.

The collecting mask 14 absorbs the component beams 16.m (16.1 to 16.M) completely which impinge thereupon.

The beam splitter 7, on the one hand, conducts the image of the component beams (($2.1_1, \ldots, 2.1_N$), ($2.2_1, \ldots, 2.2_N$)) coming from the mirrors ($6_1, \ldots, 6_N$) and passing through the collecting mask 14 into the viewing system 8.2 which evaluates the image and transmits the result to the control 13. If the desired radiation image and the actual radiation image do not correspond, the control 13 can undertake a correction by suitably driving the corresponding tilt mirrors ($6_1, \ldots, 6_N$).

The component beams (($2.1_1, \ldots, 2.1_N$), ($2.2_1, \ldots, 2.2_N$)) which pass through the beam splitter 7 are optically guided by the so-called scanning objective 9 so that they run telecentrically after leaving the scanning objective 9 and are focused on the surface 11a of the workpiece 11. Only low energy targeting beams ($2.2_1$ to $2.2_N$) are used in the set-up mode of operation. For this reason, these targeting beams only generate light points on the workpiece 11 at the locations at which the energy beams ($2.1_1$ to $2.1_N$) will later irradiate the workpiece 11. These light points are reflected at the surface of the workpiece 11 and the image of these light points is guided back through the scanning objective 9 and via the beam splitter 7 into the monitoring system 8.1 where they are evaluated and the result is transmitted to the control 13. If the desired radiation point image and actual radiation point image on the surface 11a of the workpiece 11 are not coincident, then the control 13 makes a correction by suitably driving the corresponding tilt mirrors ($6_1$ to $6_N$). The absolute correctness of the position of all light points can be checked via markers present on the workpiece 11. These markers are so configured that they are detected by the monitoring system 8.1.

If desired and actual radiation point images correspond to each other in the context of the fault tolerance, then the set-up mode of operation is successfully concluded and the control 13 can switch into the work mode of operation automatically or be switched into this mode manually.

In the set-up mode of operation, the tilt mirrors 6.n are so adjusted that the rays of the target laser 2.2 are at the locations on the workpiece surface 11a provided therefor. The beam splitter 3 is tilted out of the beam path in the processing mode of operation (and, if the target laser 2.2 was used, the target laser is now switched off and the work laser 2.1 is activated) and the work laser beam 2.10 now passes with full intensity into the optical arrangement, passes through the same optical path as the target laser 2.2 and the laser beams ($2.1_1, \ldots, 2.1_N$) which pass through the collecting mask 14, expose the photosensitive layer on the workpiece 11, and produces simultaneously, as required, a removal of material.

After ending the irradiation by means of the laser beams ($2.1_1, \ldots, 2.1_N$) at the selected positions on the workpiece 11, the set-up mode of operation is again switched in and the X-Y-coordinate table 12 can displace the workpiece 11 in such a manner that the next zone of the workpiece 11 to be processed can be placed in the operating range of the laser component beams (($2.1_1, \ldots, 2.1_N$), ($2.2_1, \ldots, 2.2_N$)) below the scanning object 9. Thereafter, the targeting operation is again started.

If more locations are to be irradiated in the operating region of the laser beams (($2.1_1, \ldots, 2.1_N$), ($2.2_1, \ldots, 2.2_N$)) than there are laser beams (($2.1_1, \ldots, 2.1_N$), ($2.2_1, \ldots, 2.2_N$)), then, after ending the first work step, the corresponding mirrors ($6_1, \ldots, 6_N$) are driven in such a manner that the component laser beams (($2.1_1, \ldots, 2.1_N$), ($2.2_1, \ldots, 2.2_N$)) are directed to the desired new positions. Component laser beams (($2.1_1, \ldots, 2.1_N$), ($2.2_1, \ldots, 2.2_N$)) which are in excess of those required are directed by the corresponding mirrors ($6_1, \ldots, 6_N$) into the collecting mask 14 provided therefor.

The mirrors ($6_1, \ldots, 6_N$) can also be displaced while the work laser 2.1 is operating for exposing resist as well as for removing material. In this way, continuous structures can be generated on or in the workpiece 11.

As a work laser 2.1 for printed circuit boards 11, especially a pulsed UV laser is suitable having a wavelength for which the photosensititve layer is sensitive as well as for which a removal of material can take place (advantageous for the constructive configuration of the optical elements). Such a laser 2.1 can be driven in a controlled manner with a pulse frequency of, for example, 100 to 200 Hz. A typical conductor track width is about 50 µm. The energy loss at the beam divider device 4 is in the order of magnitude of 50% but can be reduced by suitable configurations. The beam divider device 4 generates several hundred individual laser beams (($2.1_1, \ldots, 2.1_N$), ($2.2_1, \ldots, 2.2_N$)) (for example, 30×30, 50×50 and the like) depending upon configuration. These individual component laser beams can be distributed individually by a corresponding number of elements ($6_1, \ldots, 6_N$) in the deflecting optic 6 on the surface 11a of the workpiece 11.

In the material irradiating arrangement 1, a surface 11a of a workpiece 11 is irradiated by utilizing several discrete component beams ($2.1_1, \ldots, 2.1_N$). The deflecting device 6 has a plurality of elements ($6_1, \ldots, 6_N$) assigned to corresponding ones of the component beams ($2.1_1, \ldots, 2.1_N$). Each component beam ($2.1_1, \ldots, 2.1_N$) is deflected by the corresponding element ($6_1, \ldots, 6_N$) so that the simultaneous irradiation of different points and zones on a surface 11a of a workpiece 11 to be processed is possible. The position of the individual elements ($6_1, \ldots, 6_N$) of the deflecting device 6 are changeable in a targeted manner by a control 13 and the individual elements ($6_1, \ldots, 6_N$) of the deflecting device 6 are each displaceable in their positions at least in one coordinate direction. When irradiating, a material removal and an exposure of a photosensitive layer on a surface 11a of a workpiece 11 to be processed can take place either sequentially or simultaneously.

For the arrangement, the component beams ($2.1_1, \ldots, 2.1_N$) are determined with respect to each other forward of the deflecting device 6 or are symmetrically arranged.

The rotation points of the elements ($6_1, \ldots, 6_N$) of the deflecting device 6 of the arrangement are all arranged on an arcuate surface which can, however, also be planar.

The component beams ($2.1_1, \ldots, 2.1_N$) incident upon the elements ($6_1, \ldots, 6_N$) of the deflecting device 6 are axially symmetrical to their particular main beam.

The component beams ($2.1_1, \ldots, 2.1_N$) coming from the elements ($6_1, \ldots, 6_N$) of the deflecting device 6 are each axially symmetrical to their particular main beam.

In the deflecting device 6, diffracting and/or reflecting elements ($6_1, \ldots, 6_N$) are used as deflecting elements ($6_1, \ldots, 6_N$).

Here, the deflecting device 6 is configured of reflecting elements 6 with each reflecting element ($6_1, \ldots, 6_N$) being a mirror.

The deflecting device 6 is configured of segments ($6_1, \ldots, 6_N$) with the segments ($6_1, \ldots, 6_N$) being individually movable in or at least about one coordinate axis.

Here, the segments ($6_1, \ldots, 6_N$) are movable in about two coordinate axes.

The surface 6.2 of the reflecting elements ($6_1, \ldots, 6_N$) is planar here.

An imaging optic 9 is mounted behind the deflecting device 6.

The exposing beams ($2.1_1, \ldots, 2.1_N$) utilize laser light. A beam homogenizer 2.3 is mounted behind the laser 2.1. The laser 2.1 is utilized in pulsed operation.

The intensity of a laser beam is so selected that no unintended exposure of adjoining areas takes place.

The beam splitting device 4 divides the main beam 2.1 into several discrete component beams ($2.1_1, \ldots, 2.1_N$) and is mounted forward of the controllable deflecting device 6. The beam splitting device 4 is made up of several lenses (4.11, 4.21).

The beam splitting device 4 is made up of two arrays (4.1, 4.2) which provide that the individual beams (($2.1_1, \ldots, 2.1_N$), ($2.2_1, \ldots, 2.2_N$)) have a specific spacing with respect to each other after the beam splitting device 4.

The beam splitting device 4 generates a three-dimensional distribution of the generated component beams (($2.1_1, \ldots, 2.1_N$), ($2.2_1, \ldots, 2.2_N$)).

An optical magnification system 5 is mounted behind the beam splitter device 4.

A conductor plate is coated with a photosensitive resist material and is introduced into the device for exposure.

The beam paths of the component beams (($2.1_1, \ldots, 2.1_N$), ($2.2_1, \ldots, 2.2_N$)) has a telecentric trace ahead of the workpiece surface to be processed.

The component beams (($2.1_1, \ldots, 2.1_N$), ($2.2_1, \ldots, 2.2_N$)) impinge upon the part to be processed at an angle $\alpha$, which satisfies the particular requirements of material removal or material exposure and is advantageously less than 5°.

In the arrangement 1, a zoom system 5 is contained for generating a variable beam diameter in the processing plane.

A possible processing sequence for the manufacture of printed circuit boards in accordance with the method of the invention can take place as described below.

(1) Design of a printed circuit board on a computer (for example, a CAD system) as known per se or a handmade design.

(2) Transfer of the generated data for the printed circuit board to the computer of the system or inputting the data manually.

(3) Introducing the printed circuit board base plate into the device with the printed circuit board being coated with a resist material or photosensitive lacquer and coated with a conductive material. Alternatively, when using photosensitive electrodeposited resist, the untreated resist-free base plate must be introduced into the equipment.

(4a) Generating the structures (through-holes, line bores, grooves and the like) on or in the plate utilizing a laser for removing material. (The photoresist is no obstacle for an excimer laser beam having, for example, an energy density of 1,000 mJ/cm$^2$.) If a photosensitive electrodeposited resist is used, the resist is applied after this processing step.

(4b) Exposing the plate with a power laser attenuated to, for example, 70 mj/cm$^2$ or exposing with an appropriately power attenuated additional main laser which has been coupled in for exposing in such a manner that the desired conductor track structures are introduced into the photoresist material. The main laser can be coupled in in a manner already described with respect to the target laser.

Method steps (4a) and (4b) can be carried out sequentially or simultaneously (not for use with photosensitive electrodeposited resist).

(5) Removing the plate exposed or structured for further galvanic treatment as known from the state of the art.

The special advantage of this manufacture of printed circuit boards is that fine precise structures are produced which have not been attained previously. Furthermore, and compared to the state of the art, several work steps and processing machines are eliminated in the production of printed circuit boards because one single equipment now effects the production of the conductor tracks as well as producing material removal.

The arrangement 1 for exposing conductor tracks on printed circuit boards 11 and for removing material affords the advantages delineated below with the printed circuit boards being coated with a photosensitive lacquer for the exposure.

This arrangement 1 has the following advantages:

(a) no limitation of conductor track width or hole diameter in the downward direction; that is, conductor tracks to a width of less than 5 to 30 µm and holes to a diameter of less than 5 to 30 µm are possible;

(b) no mask-dependent or film-dependent fixed arrangement of the conductor tracks and holes but instead a variably adjustable conductor track image or hole image pattern that is, most flexibility of manufacture);

(c) no laser mask is required and therefore an improved utilization of the laser light generated;

(d) geometrically good conductor track forms or hole image forms;

(e) variable and freely programmable conductor track pattern images or hole pattern images;

(f) conductor track images or hole pattern images with variable and freely programmable conductor-track pattern density or hole pattern densities;

(g) variable, freely programmable conductor path pattern numbers or hole pattern numbers per printed circuit board;

(h) reduced processing time;

(i) the surface of the printed circuit board can be structured, that is, for example, by generating raised conductor paths or conductor paths in different planes;

(j) a high precision with respect to positioning of the conductor tracks or holes;

(k) use of different lasers or laser radiation wavelengths is possible; and, (l) capability of building into an exposure or processing line with the workpieces on the exposure or processing line being movable automatically to and away from the exposure or processing station.

Figure 6:
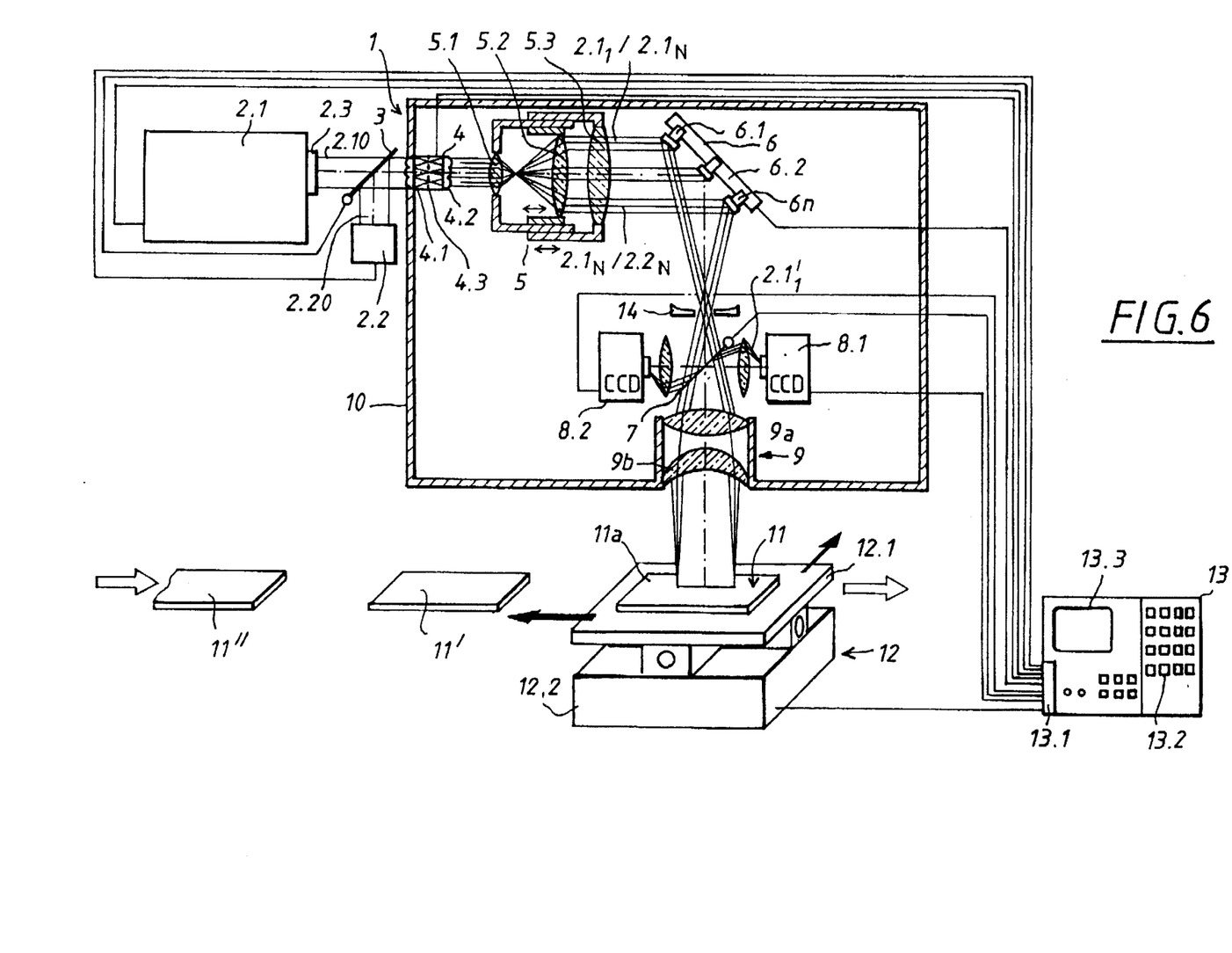
FIG. 6 is a schematic of the entire configuration of FIG. 1 with a separate zoom system.

In FIG. 6, the arrangement 1 of FIG. 1 is again shown with the cross section of the beam being changed by a separate zoom system. The zoom system is an integral component of the magnification optic 5. In lieu of the previous magnification optic 5, this magnification optic has at least one further lens (5.1, 5.2, 5.3). Also, at least one lens (5.2, 5.3) is adjustable in the optical axis relative to the input lens 5.1. The displacement takes place such that the symmetrical beams coming from the beam splitter device 4 also again leave the magnification optic 5 symmetrically.

In the embodiment described above, the beam divider device 4 can be omitted when initially several individual beams $((2.1_1, \ldots, 2.1_N), (2.2_1, \ldots, 2.2_N))$ are introduced into the arrangement 1. The used beams $((2.1_1, \ldots, 2.1_N), (2.2_1, \ldots, 2.2_N))$ do not have to be laser beams as is the case with respect to the embodiments described and shown in the drawings. All deflectable beams can be used. For example, the generation of radiation for beams which can only be deflected with difficulty can be placed directly at or on the deflecting device 6. Such radiation is that which has too great an energy loss when there is a deflection thereof. This can, for example, be the exit opening of a $CO_2$ laser or a laser diode.

Finally, a realization of the concept of the invention can, at a minimum, comprise one or more devices for generating the component beams $(2.1_1, \ldots, 2.1_N)$ as well as a device 6, which is suitable for guiding the particular beams.

The above-mentioned use of the laser beams (2.10, 2.20) leaves open many possibilities for generating individual component beams $((2.1_1, \ldots, 2.1_N), (2.2_1, \ldots, 2.2_N))$. A direct or subsequent alignment parallel to each other is imparted to these individual component beams directly or subsequently so that they have a definite spacing to each other. The individual component beams $((2.1_1, \ldots, 2.1_N), (2.2_1, \ldots, 2.2_N))$ can be generated in many ways (gratings, beam splitters, ... ) and be later formed. The generation of the beams discussed and explained with respect to the embodiment is, at the moment, only the simplest and most cost effective. A laser diode array (that is, surface arranged laser diodes) having a suitable frequency and energy density should in the future be a competitive way of generating the component beams $((2.1_1, \ldots, 2.1_N), (2.2_1, \ldots, 2.2_N))$. The expanding optic 5 downstream of the beam divider device 4 can be omitted if the component beams $(2.1_1, \ldots, 2.1_N)$ emanating from the beam divider device 4 already have the desired cross section.

The collecting mask 14 can be omitted when the component beams $(2.1_1, \ldots, 2.1_N)$ are deflected onto an area suitable therefor by the deflecting device 6 outside of the surface 11a to be processed.

One of the two beam control cameras (8.1, 8.2) can be omitted when there is sufficient time for irradiation or inaccurate shots of radiation are permissible during irradiation if it is ensured that the beam deflection 6 always takes place in the desired manner (control of the deflecting device).

The scanning objective 9 can be omitted when one allows an inclined irradiation of material at the edge or if the dimensions of the surface 11a to be processed permit this.

The X-Y-table 12 can be omitted when the surface 11a to be processed is never greater than the reflecting capability of the deflecting device 6.

The deflecting device 6 can in practice look differently even if laser beams $((2.1_1, \ldots, 2.1_N), (2.2_1, \ldots, 2.2_N))$ are used. In lieu of the reflecting surfaces, other known types of beam deflection (for example, planar lens pairs or rotating wedge pairs for laser beams) can be used. The use of the diffracting bodies means a greater loss of energy.

The target laser 2.2 can be omitted when the work laser 2.1 is sufficiently attenuated by the beam splitter 3 for determining the beam position on the workpiece surface 11a.

The beam cross sections used must not be round as shown; instead, any desired form which is possible in accordance with the known state of the art can be used.

The scanning objective 6 does not necessarily have to comprise two lenses (9.1, 9.2) arranged one behind the other; instead, the number of lenses can vary in the radiation axis as well as in the coordinate axis lying perpendicularly thereto.

The beam divider device 4 can be omitted when this task is assumed, for example, by the deflecting device 6.

In lieu of the beam attenuation of the main laser discussed above with respect to FIG. 1, a laser can be used for exposing the photosensitive layer different from the laser utilized for material removal. The ancillary or target laser 2.2 and the exposure laser can be coupled into the main beam path via a further beam divider which likewise can be configured so as to be pivoted in and out. All three lasers can then be used alternately or in any suitable combination. The arrangements which can be realized can selectively irradiate individual elements of the deflection device (mirror elements). The mirror elements can selectively or exclusively be irradiated with an exposure beam source (for example, 3 watts mean power at, for example, a wavelength of advantageously 364 nm) and a material-removing beam source (such as 60 watts mean power at a wavelength of advantageously 308 nm).

The change of the beam diameter can, as described, take place via the beam divider device 4 or via a separate zoom system.

The integration of the separate zoom system can be provided in an advantageous manner between the beam divider device 4 and the expansion optic 5. This zoom system can then generate different beam diameters for the laser removal of material as well as for the exposure. This can be done in dependence upon the structural configuration of the zoom system according to the state of the art either for all beams in common or only for a portion of the beams or for several different beam diameters for different beams.

Structures of different size can be produced or exposed, that is, in one step at the same time or sequentially without a superposition of several fine structures being necessary.

The diameter or the width of the holes and conductor tracks should then advantageously be between 5 and 40/100 µm.

In lieu of the photosensitive resist on the printed circuit board coated with a conductive material, the conductor tracks can also be produced in that a fine powder of a conductive material (for example, photosensitive electrodeposited resist, obtainable, for example, from the Nippon Paint Company, Ltd. or Fuji Machinery Manufacturing and Electronics Company, Ltd., Osaka, Japan) is applied on the conductor plate in a thin layer which is bonded tightly to the conductor plate under the action of a laser beam to form a closed continuous conductor path. The powder, which is not irradiated, can be easily removed from the printed circuit board after irradiation. The corresponding materials are known from the state of the art as discussed above.

It is also possible to irradiate a non-conductive material with laser light in order to convert this material into a conductive state whereby conductive tracks are produced. These materials are also known from the state of the art.

The arrangement permits conductive tracks to be produced to every desired depth by appropriate focussing of the laser beam. If, in each plane, and advantageously starting with the lowermost, the conductive tracks are produced separately, mutually crossing conductor tracks can be produced in a three-dimensional space with the conductor tracks not necessarily being connected with each other. However, if desired, these conductor tracks can indeed be connected.

It is also known to produce structures with a laser beam wherein the conductive atoms (for example, chromium atoms) are fed into the laser beam. These conductive atoms together with the laser beam then reach only those locations on the substrate (for example, silicon) over which the laser light is swept. Only with the arrangement described above, is it now possible to carry out the above step in an acceptable time period.

The arrangement described above for exposing and removing material of a surface of a workpiece uses several discrete component beams simultaneously in order to make possible a more rapid exposure and material removal on the workpiece surface. The direct exposure of the printed circuit boards with radiation (for example, ultraviolet laser light, ultraviolet light or other useable beams) permits the masked films to be omitted and an increase of the structural accuracy of the conductor tracks to be provided later and/or holes and thereby makes possible the production of structures and conductor tracks of significantly less than 100 µm or 50 µm and holes having a diameter of less than 5 µm in a very short time.

It is especially advantageous that a combination of material processing (for example, boring holes, producing edges and recesses) and exposing the photosensitive layer is possible with one and the same device.

Each component beam is deflected by an element of a deflecting device wherein the element is assigned to the particular component beam. The particular deflection can be freely adjusted in at least one axis by a control device.

This makes possible the simultaneous irradiation of possibly different points or conductor tracks on a surface of a workpiece to be processed.

The position of the individual elements of the deflecting device can be changed in a targeted manner by a control and the individual elements of the deflecting optic can each be displaced discretely in their positions in at least one coordinate direction. For these reasons, a significantly greater speed of irradiation as well as simultaneously new possibilities are obtained when compared to the state of the art. This is also true because the change of the deflection can take place statically (this is, after each exposure) as well as dynamically that is, during the exposure).

It is possible, not only to provide a point-shaped irradiation, but simultaneously linear structures and conductor tracks can be produced on the workpiece surface.

With the invention, it is possible to obtain an arrangement which is significantly faster because exposure or removal of material can take place simultaneously at several freely selectable locations on the surface of the workpiece. These locations do not have to be the same on the next workpiece but can, instead, be freely determined for each different workpiece which is processed.

The deflecting device can be moved in the irradiation axis when the beams are defined with respect to each other forward of the deflecting device or are symmetrically arranged. This can be done without it having a negative effect on the surface of the workpiece.

A compact unit is obtained if the pivot points of the elements of the deflecting device are all arranged in one plane. This, however, has optical disadvantages.

If in contrast, the elements of the deflecting device are arranged on a parabola, then the beams run telecentrically in the irradiation space and are uniformly distributed. This advantage is obtained with the disadvantage that different intercept widths are provided for each beam from which a sharpness problem results.

This can be avoided if the elements of the deflecting device are arranged spherically in such a manner that the outgoing beams at least approximately intersect at a focus point, which is at least approximately in the center of the receiving mask. The surface of the elements of the deflecting device can then be configured spherically. This possibly has the disadvantage of higher costs.

The surface area to be processed can be freely selected when the component beams, which come from the elements of the deflecting device, are symmetrical with respect to their particular main beam. For this purpose, the spacing between the scan objective and the surface to be processed has to remain fixed.

In the deflecting device, diffracting and/or reflecting elements can be utilized as deflecting elements. These elements afford the advantage that they can be produced at low cost pursuant to the known state of the art.

If the deflecting device is built up of reflecting elements then especially electromagnetic beams can be excellently deflected. Especially mirrors are suitable as reflecting elements.

The deflecting device is configured of segments. This permits a very cost-effective manufacture. Each of the segments can be individually movable in at least one coordinate axis or at least be movable about at least one coordinate axis. By being movable in the coordinate axis orthogonally to the deflection surface makes possible a variation in elevation of each individual focus with respect to the surface of the workpiece. A movability about a coordinate axis facilitates a position change of the beams in the processing plane.

It is advantageous when the segments are movable in or about two coordinate axes. This makes possible the irradiation of all points on the surface of the workpiece and not only the irradiation of points along an irradiation line.

The surface of the reflecting element can be planar so that the incoming as well as the reflected component beams of the radiation can all be mutually parallel so that the cross section of each beam is unaffected.

An imaging optic is provided behind the deflecting device which can be characterized as a scanning objective so that the radiation impinges as perpendicularly as possible on the surface of the workpiece to be processed.

The surfaces of the elements of the deflecting device can, however, be so formed (for example, by utilizing mirrors), that a reflected beam is focused on the surface of the workpiece by the elements of the deflecting device. Then, a scan objective can be omitted as may be required.

The rays are advantageously from laser light because excellent beam guiding techniques at low cost are known for laser light and laser light affords a suitable selection of wavelengths for exposure of the resist as well as for removal of material. Laser beams afford the further advantage that they can be easily directed and can be changed with low-cost optics. However, other dividable component beams can be used (for example, electron beams, x-rays, et cetera).

When the rays are of laser light, it is advantageous when the arrangement contains a discrete deflecting optic for each component beam.

A diffracting element should be included in this deflecting device. This makes possible the use of component beams, which are at least defined with respect to each other or are incident symmetrically on the deflecting device. These component beams are only focused on the surface of the workpiece by the deflecting device. This diffracting element is either on or rearward of a reflecting element so that it can be used simultaneously by many component beams.

A beam homogenizer is advantageously mounted behind the laser so that the radiation emanating from the laser has the same large energy density for all component beams. A possible radiation homogenizer is, for example, disclosed in German Patent 3,918,293. With this beam homogenizer, it can be ensured that a plurality of component beams generated from a laser beam all have the same intensity.

The laser can be driven in pulsed operation because, with pulsed lasers, a high power with low complexity is obtained, on the one hand, while, on the other hand, a more targeted surface irradiation can be carried out with pulsed radiation (for example, preventing unwanted blooming or preventing the unwanted thermal side reactions on the workpiece). However, continuous radiation is preferred especially for exposing.

For pulsed operation, the intensity of a laser flash is so selected that just an adequate exposure takes place. This permits producing linear structures and conductor paths of uniform width on the surface of the workpiece to be processed.

The number of radiation sources which are needed is greatly reduced when a beam divider device is provided which divides at least one beam into a plurality of discrete component beams. In this way, an intense beam can be subdivided into several weaker component beams which each have an adequate energy density. This makes possible the reduction of the costs for the generation of the component beams. The beam divider arrangement is then preferably mounted forward of the controllable deflecting device.

A very simple configuration is obtained when the beam divider device is built up of several lenses. This simple configuration is supported when the beam divider device is made up of two arrays which ensure that the individual component beams have a certain distance with respect to each other after the beam divider device.

In order to process an area individually as rapidly as possible, a division of the component beams takes place over an area. It is advantageous in this context when the beam divider is built up of an array which generates a two-dimensional distribution of the generated component beams on the surface of the workpiece.

An optical magnification system is mounted rearward of the beam divider device in order to adapt the dimensions of the irradiated field to the dimensions of the deflecting device.

The radiation impinges upon the surface of the coated printed circuit boards to be processed at an angle $\alpha$ which is adapted to the particular requirements. The described device makes possible angles $\alpha$ which are very small (for example, less than 5°). This ensures a uniform width of the conductor tracks to be produced and an excellent dimensioning as to form of the areas such as holes or lines.

The position of the locations on the surface of the workpiece can be statically or dynamically changed by a controllable deflecting device during exposure taking data from a computer connected thereto.

The exposing laser and the laser for removing material should be identical in order to facilitate the optical computations. Different lasers can be, however, used selectively.

The wavelength of the laser should lie in the range between 193 nm and 12 μm and the energy densities on the surface of the workpiece should lie in the range of approximately 750 to 3,000 mJ/cm² for material removal or in the range of approximately 5 to 130 mj/cm² for exposing resist (provided that state of the art resists are used).

It is understood that the foregoing description is that of the preferred embodiments of the invention and that various changes and modifications may be made thereto without departing from the spirit and scope of the invention as defined in the appended claims.

What is claimed is:

1. A method of irradiating a workpiece having a photosensitive layer formed thereon, the method comprising the steps of:

forming a plurality of discrete component beams which are separate from each other;

providing a deflecting device having a plurality of movable deflecting elements corresponding to respective ones of said component beams for individually and adjustably directing each of said component beams; and, controlling said deflecting elements to deflect each of said component beams individually onto said photosensitive layer so as to simultaneously irradiate respectively different points or zones on the surface of said workpiece with corresponding ones of said discrete component beams thereby exposing said photosensitive layer.

2. The method of claim 1, wherein said individual elements have respective positions; and, said method comprising the further step of shifting each of said deflecting elements discretely at least in one coordinate direction at the position thereof.

3. The method of claim 1, wherein said component beams are determined relative to each other or arranged symmetrically ahead of said deflecting device.

4. The method of claim 1, wherein the light of a laser is used as said component beams.

5. The method of claim 4, comprising the further step of homogenizing said light of said laser with a beam homogenizer before said laser light impinges upon said workpiece.

6. The method of claim 1, wherein a supply device includes a laser for generating laser radiation for said discrete component beams, the method comprising the further step of selecting the intensity of the laser radiation so that no unintended exposure of adjoining areas takes place.

7. The method of claim 1, wherein a radiation distributing device having an array is provided; and, wherein the method comprises the further step of distributing said component beams in three dimensions utilizing said radiation distributing device.

8. The method of claim 1, comprising the further steps of:
providing a material irradiating apparatus; and, introducing a printed circuit board into said material irradiating apparatus for irradiating said printed circuit board, said printed circuit board being coated with photosensitive resist material.

9. The method of claim 8, wherein the wavelength of the radiation of the irradiating beams lies in a range of between 300 and 400 nm when exposing.

10. The method of claim 1, wherein said workpiece has a surface defining a processing plane and wherein said method comprises the further step of imparting a variable beam diameter to the irradiating beams utilizing a zoom system.

11. The method of claim 1, wherein material is removed and an exposure takes place sequentially or simultaneously of a photosensitive layer on a surface of a workpiece to be processed.

12. The method of claim 1, further comprising the step of holding said workpiece in a stationary position during the irradiation of said photosensitive layer thereof.

13. An arrangement of irradiating a workpiece having a photosensitive layer formed thereon, the arrangement comprising:

means for forming a plurality of discrete component beams which are separate from each other;

a deflecting device having a plurality of movable deflecting elements corresponding to respective ones of said component beams; and, means for controlling said deflecting elements to deflect each of said component beams individually onto said photosensitive layer so as to simultaneously irradiate respectively different points or zones on the surface of said workpiece with corresponding ones of said discrete component beams thereby exposing said photosensitive layer.

14. The arrangement of claim 13, further comprising means for holding said workpiece in a stationary position during the irradiation of said photosensitive layer thereof.

* * * * *